United States Patent [19]
Choi

[11] Patent Number: 6,083,659
[45] Date of Patent: *Jul. 4, 2000

[54] POLYMER MIXTURE FOR PHOTORESIST AND PHOTORESIST COMPOSITION CONTAINING THE SAME

[75] Inventor: Sang-jun Choi, Seoul, Rep. of Korea

[73] Assignee: Samsung Electronics Co., Ltd., Suwon, Rep. of Korea

[ * ] Notice: This patent is subject to a terminal disclaimer.

[21] Appl. No.: 09/218,028

[22] Filed: Dec. 22, 1998

[30] Foreign Application Priority Data

Apr. 20, 1998 [KR] Rep. of Korea ....................... 98-14071

[51] Int. Cl.[7] ..................................................... G03F 7/004
[52] U.S. Cl. ....................... 430/270.1; 430/910; 525/132; 525/225
[58] Field of Search ................................. 430/270.1, 910; 525/225, 132; 526/323.2

[56] References Cited

U.S. PATENT DOCUMENTS

| | | | |
|---|---|---|---|
| 4,491,628 | 1/1985 | Ito et al. | 430/270.1 |
| 5,368,976 | 11/1994 | Tajima et al. | 430/176 |
| 5,733,704 | 3/1998 | Choi et al. | 430/270.1 |
| 5,847,063 | 12/1998 | Choi et al. | 526/323.2 |

*Primary Examiner*—John S. Chu
*Attorney, Agent, or Firm*—Jones Volentine, LLP

[57] ABSTRACT

A polymer mixture for a photoresist composition, and a photoresist composition containing the polymer mixture. The polymer mixture includes a polymer that has two or more different monomers and an acid-labile di-alkylmalonate group bound to the backbone of the polymer; a polymer that has a monomer of (meth)acrylate derivative and one or more other monomers; or a polymer that has a monomer of alkoxystyrene and one or more other monomers. The polymer mixtures are suitable for forming photoresist compositions that generate a pattern having an excellent profile, due to the high contrast and high thermal decomposition temperature of the photoresist composition. The photoresist composition of the present invention further include a photosensitive acid generator.

26 Claims, 1 Drawing Sheet

POLYMER MIXTURE FOR PHOTORESIST AND PHOTORESIST COMPOSITION CONTAINING THE SAME

BACKGROUND OF THE INVENTION

1. Field of the Invention

The present invention relates to a material for forming a semiconductor device, and more particularly, to a polymer mixture for a chemically amplified photoresist used in photolithography, and to a photoresist composition containing the polymer mixture.

2. Description of the Related Art

Current semiconductor chips are highly integrated and require complicated manufacturing processes. For example, photolithography processes are needed that are capable of forming fine patterns in the range of 0.25 μm or less. Such fine patterns must be formed using deep ultraviolet (UV) rays of 248 nm, which have a shorter wavelength than conventional g-line (436 nm) and I-line (365 nm) rays. However, when deep-UV rays are used, a smaller number of protons are transferred when a dose of the same energy as a conventional light source is irradiated. Therefore, a dose of much greater energy is required when deep-UV rays are used in order to transfer the same number of protons and obtain the same result as is achieved using conventional photolithography. To overcome this problem, a new material referred to as a "chemically amplified photoresist" has been introduced, which is highly sensitive to protons, due to its improved photosensitivity even when deep-UV rays are irradiated at a similar dose to that used with conventional light source irradiation.

In general, the chemically amplified photoresist includes an acid-labile group which is easily subjected to hydrolysis by an acidic catalyst, and which functions as a dissolution inhibitor. The amplified photoresist also includes a photosensitive acid generator for generating protons $H^+$ (i.e., acid) by exposure to light. When the chemically amplified photoresist is exposed to light, acid is generated by the photosensitive acid generator. The dissolution inhibitor which is bound to the backbone of the polymer, is then hydrolyzed by the catalytic reaction of the generated acid, thereby changing the polarity (e.g., solubility) of the polymer. The acid hydrolysis of the polymer by the diffusion of acid produces a pattern having a higher transparency.

Thus, contrast, (i.e., an index representing the difference in solubility of a chemically amplified photoresist before and after the exposure to light) is determined by the acid-labile group bound to the backbone of the polymer.

U.S. Pat. No. 4,491,628 discloses a chemically amplified photoresist containing a polymer and using t-butoxycarbonyl (t-BOC) as an acid-labile group. However, this chemically amplified photoresist has a thermal decomposition temperature [Td] that is lower than its glass transition temperature [Tg]. Thus, if the photoresist is baked to a temperature that is above the glass transition temperature before exposure to light in order to vaporize unwanted organic solvent and make the photoresist film hard, the photoresist decomposes. On the other hand, if the pre-baking temperature is low enough to prevent thermal decomposition, airborne contaminants can be absorbed into the surface of the exposed photoresist film, thereby preventing a catalytic reaction by the acid. This results in a pattern having an inferior profile, such as T-top profile. T-top profiles are the result of airborne contaminants absorbed into the photoresist film surface which neutralize the acid that is generated by the photoresist upon exposure to light. As a result, some portions of the exposed photoresist do not undergo acid hydrolysis and thus remain insoluble. The insoluble portions of the photoresist are not developed by the developer and result in T-top profiles.

SUMMARY OF THE INVENTION

To solve the above problems, it is an objective of the present invention to provide a polymer mixture for a chemically amplified photoresist having a larger contrast and excellent thermal characteristics.

It is another objective of the present invention to provide a photoresist composition having excellent thermal characteristics that has high contrast and therefore forms a high resolution pattern.

To achieve the first objective, the present invention provides a polymer mixture for use in a chemically amplified photoresist includes polymer (A) polymerized with two or more different monomers and having an acid-labile di-alkylmalonate group bound to the backbone of the polymer; and a polymer (B) polymerized with a monomer of (meth)acrylate derivative and one or more other monomers; or a polymer (B) polymerized with a monomer of alkoxystyrene and one or more other monomers. Preferably, the polymers (A) and (B:) are mixed at a weight ratio ranging from about 0.1:0.9 to 0.5:0.5.

In a preferred embodiment, the di-alkylmalonate group is either di-t-butylmalonate group or di-tetrahydropyranylmalonate group.

A photoresist composition of the present invention includes the polymer mixture and a photosensitive acid generator in an amount ranging from about 1 to 15 weight percent based on the weight of the polymer mixture. Preferably, the photoresist composition further includes an organic base, e.g., amine derivatives in an amount of from about 0.01 to 2.0 weight percent based on the weight of the polymer mixture.

The polymer mixture of the present invention has a di-alkylmalonate group as a dissolution inhibitor attached to the polymer backbone. The dissolution inhibitor is very bulky before exposure to light. However, exposure causes the photosensitive acid generator to form acid which hydrolyzes the dissolution inhibitor thereby producing malonic acid and making the dissolution inhibitor less bulky. The acid hydrolysis significantly increases the solubility of the photoresist and this results in contrast that is significantly better than that obtained using conventional photoresist compositions. Importantly, the thermal decomposition temperature Td of the photoresist compositions of the present invention is higher than the glass transition temperature Tg, so the photoresist film can he hardened by pre-baking before exposure using a pre-bake temperature that is higher than the glass transition temperature. The high temperature pre-bake prevents a defective pattern profile, such as a T-top, to be formed due to damage by contaminants.

BRIEF DESCRIPTION OF THE DRAWINGS

The accompanying drawings illustrate embodiments of the invention, in which.

DESCRIPTION OF THE PREFERRED EMBODIMENTS

Figure 1:
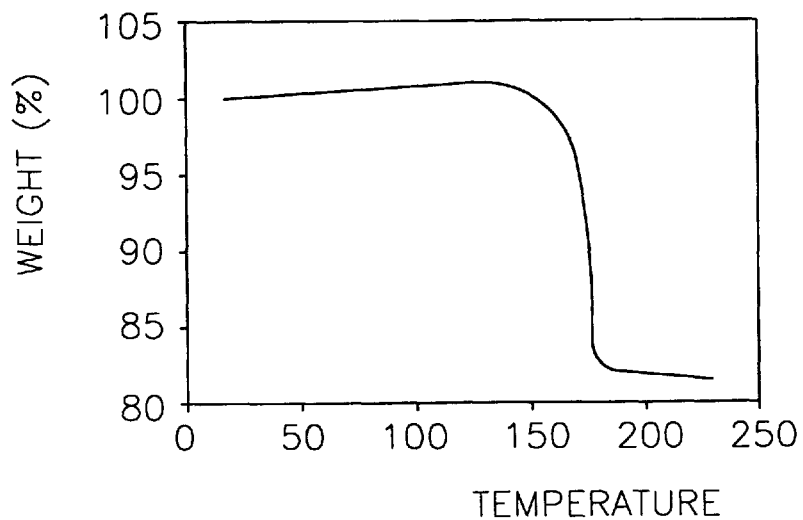
FIG. 1 is a graph showing the result of a thermogravimetric analysis on a copolymer constituting a polymer mixture for a photoresist according to the present invention.

A polymer mixture for a chemically amplified photoresist and a photoresist composition containing the polymer mixture, will be hereinafter described in detail with reference to FIG. 1 and FIG. 2. A method of preparing the photoresist composition and a photolithography process using the photoresist composition will also be described.

Polymer Mixture for Chemically Amplified Photoresist

A polymer mixture for a chemically amplified photoresist according to the present invention is a mixture including a polymer A containing an acid-labile di-alkylmalonate group bound to the polymer backbone and polymerized with two or more monomers. In addition to polymer A, the polymer mixture includes either a polymer B polymerized with a monomer of (meth)acrylate derivative and one or more other monomers; or a polymer C polymerized with an alkoxystyrene monomer and one or more other monomers. In a preferred embodiment, the di-alkylmalonate group is di-t-butylmalonate or di-tetrahydropyranylmalonate. The mixing ratio of polymer A to polymer B or polymer C is preferably in the range of from about 0.1:0.9 to 0.5:0.5 by weight.

The polymer mixture for a chemically amplified photoresist according to a first embodiment of the present invention is a mixture of a copolymer expressed by the following chemical formula (CF1) and a copolymer expressed by the following chemical formula (CF2).

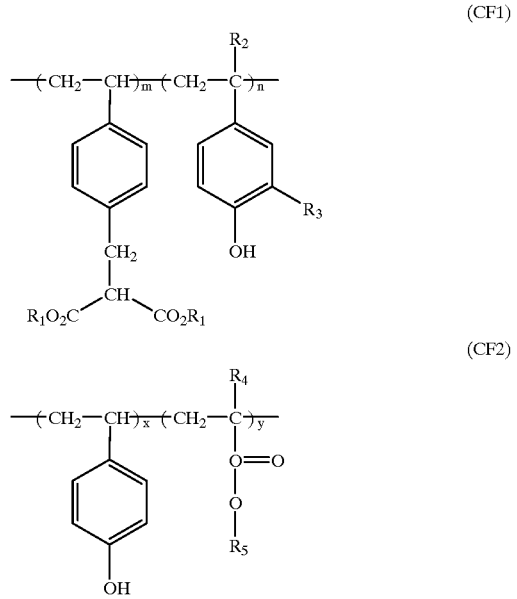

In chemical formulae (CF1) and (CF2), R1 and R5 are t-butyl or tetrahydropyranyl; R2, R3 and R4 are each independently hydrogen or methyl; and m, n, x and y are integers. The ratio of m/(m+n) is 0.01 to about 0.5, and the ratio of y/(x+y) is from about 0.01 to 0.5.

Preferably, a mixing ratio of the polymers expressed by the chemical formulae (CF1) and (CF2) is in the range of from about 0.1:9 to about 0.5:0.5 by weight, and the weight average molecular weight of each polymer is in the range of from about 5,000 to about 100,000.

In a preferred embodiment, R1 of the chemical formula (CF1) is t-butyl, both R2 and R3 are hydrogen, and R4 of the chemical formula (CF2) is hydrogen, and R5 is t-butyl or tetrahydropyranyl.

In a preferred embodiment, R1 of the chemical formula (CF1) is t-butyl, both R2 and R3 are hydrogen, and R4 of the chemical formula (CF2) is methyl, and R5 is t-butyl or tetrahydropyranyl.

A polymer mixture according to a second embodiment of the present invention is a mixture of the copolymer expressed by the chemical formula (CF1) and a copolymer expressed by the following chemical formula (CF3).

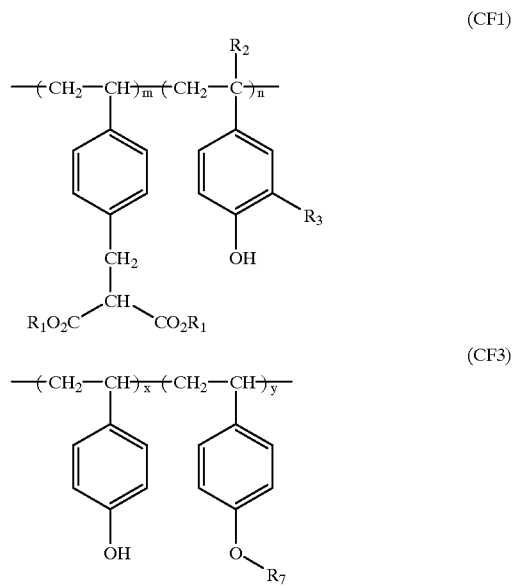

In chemical formulae (CF1) and (CF3), R1 is t-butyl or tetrahydropyranyl, R2 and R3 are done hydrogen or methyl, R7 is alkoxy-1-ethyl, tetrahydropyranyl, t-butyl or t-butoxycarbonyl, and m, n, x and y are integers. The ratio of m/(m+n) is from about 0.01 to about 0.5, and the ratio of y/(x+y) is from about 0.01 to about 0.5. Preferably, a mixing ratio of the polymers expressed by the chemical formulae (CF1) to (CF3) ranges from 0.1:9 to 0.5:0.5 by weight. The weight average molecular weight of each polymer ranges from about 5,000 to 100,000.

Preferably, R1 of the chemical formula (1) is t-butyl, R2 and R3 are hydrogen, and R7 of the chemical formula (3) is ethoxy-1-ethyl, tetrahydropyranyl, t-butyl or t-butoxycarbonyl.

Photoresist Composition

A photoresist composition according to the present invention includes one of the above-described polymer mixture and a photosensitive acid generator in an amount of from about 1 to 15 weight percent based on the weight of the polymer mixture.

Preferably, a material having a high thermal stability is used as the photosensitive acid generator. Accordingly, triarylsulfonium salts, diaryliodonium salts or sulfonates may be used.

In another preferred embodiment, the photoresist composition according to the present invention further contains an organic base ranging from about 0.01 to 2.0 weight percent based on the weight of the polymer mixture. The organic base may be triethylamine, triisobutylamine, diethanolamine or triethanolamine. The organic base prevents a decrease in a critical size of the pattern after exposure to light, caused by acid diffusing from an exposed portion to a unexposed portion.

The photoresist compositions of the present invention have a dissolution inhibitor that includes a polymer (A) that has an acid-labile di-alkylmalonate group bound to the backbone of polymer A that functions as a dissolution inhibitor. Di-alkylmalonate is hydrolyzed into malonic acid by the acid generated by the photosensitive acid generator through exposure to light. The acid hydrolysis significantly increases the solubility (i.e., contrast) of the photoresist composition after exposure by decreasing the size of the dissolution inhibitor. Also, because the di-alkylmalonate group and the photosensitive acid generator are both thermally stable, the photoresist compositions of the present invention have the important advantage of being thermally stable at temperatures that are higher than its glass transition temperature of approximately 130° C.

Preparation Method of Polymer

1. Preparation method of copolymer expressed by chemical formula (1), having di-alkylmalonate group 1-1. Preparation of monomer: di-alkylmalonylmethylstyrene (II)

As shown in the following reaction formula (RF1), after dissolving di-alkylmalonate (I) in an organic solvent such as tetrahydrofuran [THF] in which sodium hydride has also been dissolved, chloromethylstyrene is added to the solution. Di-alkylmalonylstyrene (II) is obtained through a substitution reaction.

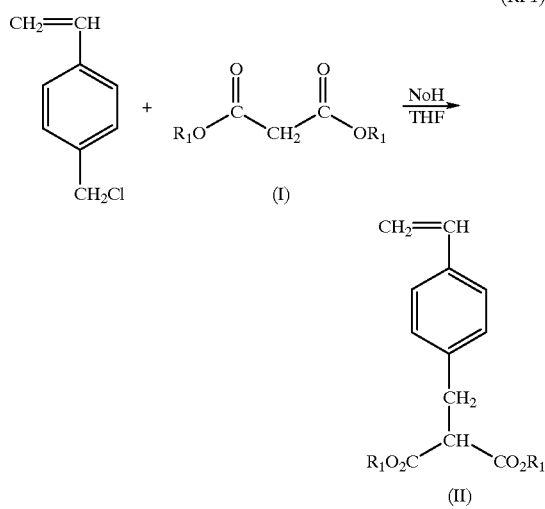

In reaction formula (RF1), R1 is t-butyl or tetrahydropyranyl group.

1-2. Preparation of copolymer (IV) polymerized with di-alkylmalonylmethylstyrene (II) and acetoxystyrene or acetoxystyrene derivative (III) monomers Copolymer (IV) is obtained through the reactions expressed by the following reaction formula (RF2).

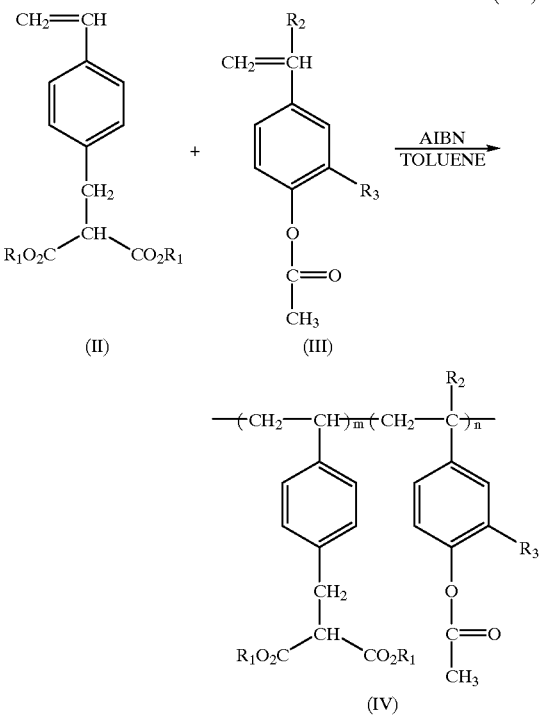

In reaction formula (RF2), R1 is t-butyl or tetrahydropyranyl, R2 and R3 are each independently hydrogen atoms or methyl, and m and n are integers. The ratio of m/(m+n) is about 0.01 to about 0.5.

After dissolving di-alkylmalonylmethylstyrene (II) and acetoxystyrene or acetoxystyrene derivative (III) in an organic solvent, e.g., toluene, a polymerization initiator, e.g., azobisisobutyronitrile (AIBN), is added to obtain copolymer (IV) through polymerization.

1-3. Deacetylation of copolymer (IV)

As shown in the following reaction formula (RF3), copolymer (IV) is dissolved in solvent, and is deacetylated using an organic base (which is ammonium hydroxide or hydrazine), to form copolymer (V) having a weight average molecular weight ranging from of from about 5,000 to about 100,000, and represented by the chemical formula (CF1).

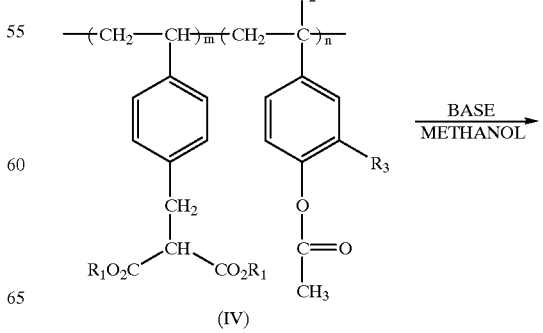

-continued

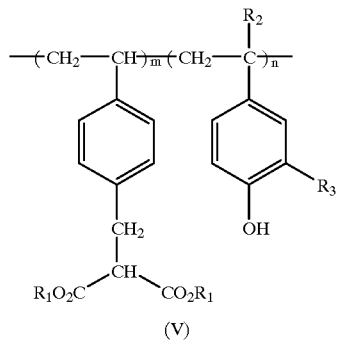

(V)

2. Preparation method of copolymer expressed by chemical formula (2)

2.1 Preparation of copolymer (VIII) polymerized with monomers of acetoxystyrene (VI) and (meth)acrylate derivative (VII)

Copolymer (VIII) is obtained through the reactions expressed by the following reaction formula (RF4).

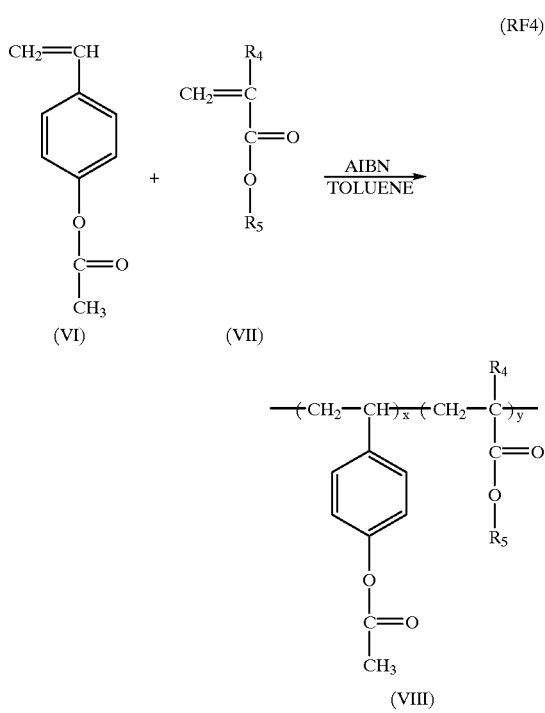

In reaction formula (RF4), R5 is t-butyl or tetrahydropyranyl, R4 is hydrogen or methyl, and x and y are integers. The ratio of y/(x+y) is from about 0.01 to about 0.5.

After dissolving acetoxystyrene (VI) and (meth)acrylate derivative (VII) in an organic solvent, such as toluene, a polymerization initiator such as AIBN is added to obtain copolymer (VIII) through polymerization.

2-2. Deacetylation of copolymer (VIII)

As shown in the following reaction formula (RF5), copolymer (VIII) is dissolved in methanol and then deacetylated using a base, resulting in copolymer (IX) which has a weight average molecular weight ranging from 5,000 to 100,000 represented by the chemical formula (CF2).

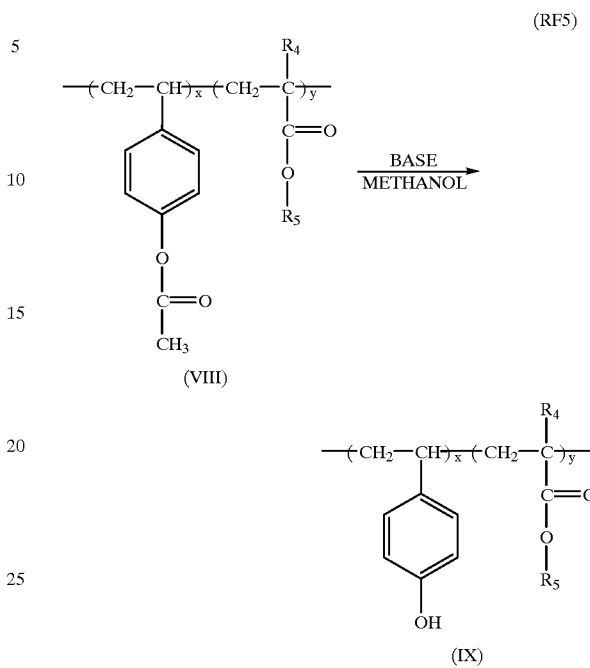

Preparation Method of Photoresist Composition, and Photolithography Method using the Composition According to a first embodiment of the present invention, a polymer (A) (e.g., a copolymer of chemical formula (CF1)) having an acid-labile di-alkylmalonate group bound to the polymer backbone, and polymerized with two or more monomers is mixed with polymer (B) (e.g., a copolymer of chemical formula (CF2)) containing (meth)acrylate derivative monomer at a weight ratio of A to B ranging from about 0.1:0.9 to about 0.5:0.5 by weight and then dissolved in a proper solvent.

Next, a photosensitive acid generator in an amount ranging from about 1 to 15 weight percent based on the weight of the polymer mixture is added to the solvent containing the polymer mixture to obtain a chemically amplified photoresist composition. In preferred embodiment, the photosensitive acid generator is a triarylsulfonium salt, a diaryliodonium salt or a sulfonate which is thermally stable at 150° C.

In preferred embodiment, an organic base in an amount ranging from about 0.01 to 2.0 weight percent based on the weight of the polymer mixture is further added to the solvent/polymer/photosensitive acid generator mixture to form a photoresist composition. In a preferred embodiment, the organic base is triethylamine, triisobutylamine, diethanolamine or triethanolamine.

According to a second embodiment of the present invention, a polymer (A) represented by chemical formula (CF1) having an acid-labile di-alkylmalonate group pendent from the polymer backbone and polymerized two or more monomers is mixed with a polymer (B) represented by chemical formula (CF2) and containing alkoxystyrene monomer, are mixed at a weight ratio of A to B ranging from about 0.1:0.9 to 0.5:0.5, and then dissolved in a proper solvent. Next, a photosensitive acid generator and an organic base are mixed with the solution by the same method as in the first embodiment, resulting in a photoresist composition.

The chemically amplified photoresist compositions prepared by the above method may be applied to a general photolithography process. Particularly, the chemically amplified photoresist composition is suitable for forming a fine pattern having a design rule of 0.25 μm or less, using deep ultraviolet rays as a light source to expose the photoresist.

First, the above-described photoresist composition is coated on a substrate having a target layer to be patterned, to form a photoresist film having a predetermined thickness. Then, the photoresist film is pre-baked before exposure. The acid-labile di-alkylmalonate-containing dissolution inhibitor and the photosensitive acid generator used in the photoresist compositions of the present invention are both thermally stable. Therefore, the photo resist compositions containing these compounds have a high thermal decomposition temperature Td of approximately 170° C. or more, which is higher than their glass transition temperature Tg which is approximately 130° C. Having a Td that is higher that the Tg makes it is possible to pre-bake the photoresist at a high temperature before exposure to light to harden it without causing the photoresist to decompose. Thus, damage of the photoresist film by airborne contaminants can be effectively prevented when the photoresist compositions of the present invention are used.

After pre-baking, the photoresist film is exposed to a deep ultraviolet ray light source, using a mask having a predetermined pattern. Acid is generated by the photosensitive acid generator in the photoresist film upon exposure, and the di-alkylmalonate group bound to the polymer is converted into malonic acid by acid hydrolysis due to the catalytic reaction of the generated acid. The acid hydrolysis causes a significant difference in the polarity of the exposed portion of the photoresist film and the polarity of the unexposed portion thereby creating a high contrast.

After the exposure, the photoresist film undergoes a short post-exposure thermal treatment before development. The post-bake activates acid hydrolysis thereby completely converting any di-alkylmalonate remaining in the exposed portion into malonic acid and increasing the contrast.

Next, the photoresist is developed using an appropriate developer which is selected depending on whether the photoresist film is a positive or a negative photoresist. Thereafter, the standard processes are executed to complete the photoresist pattern formation. A high resolution photoresist pattern having a good profile is formed using the photoresist compositions of the present invention.

Hereinafter, the polymer mixture, the photoresist composition containing the polymer mixture, and photolithography using the photoresist compositions of the present invention will be described through the following nonlimiting examples.

EXAMPLE 1

Preparation of di-t-butylmalonylmethylstyrene (DBMST) monomer 4.8 g (0.12 mol) of sodium hydride was dissolved in 250 ml of tetrahydrofuran [THF]. 25 g (0.11 mol) of di-t-butylmalonate was slowly dropped into the solution and reacted for about 1 hour at room temperature. Then, 0.1 mole (16 g) of chloromethylstyrene was slowly dropped into the mixture at 0° C. The mixture was then warmed to room temperature and reacted for 12 hours to permit completion of the substitution reaction. The reaction product was dissolved in water, neutralized with hydrochloric acid, and extracted using diethyl ether.

After drying the obtained reactant using magnesium sulfate, the reaction product DBMST monomer was separated using column chromatography (yield 65%).

Nuclear Magnetic Resonance (NMR) and Fourier Transform Infrared Radiation (FT-IR) spectroscopy analyses were performed on the obtained DBMST monomer and the results are as follows.

$^1$H-NMR(CDCl$_3$)(ppm): 1.4(s,18H), 3.1(d, 2H), 3.5(t, 1H), 5.2(dd, 1H), 5.7(dd, 1H), 6.6(dd, 1H), 7.2(m, 4H)

FT-IR(NaCl)(cm$^{-1}$): 2978(C—H, t-butyl), 1727(C=O), 1369, 1140, 847

EXAMPLE 2

Preparation of copolymer (DBMST-acetoxystyrene (AST))

3 g (9 mmol) of DBMST monomer and 4.5 g (27 mmol) of AST were dissolved in 35 ml of toluene. Then, 0.35 g of AIBN was added as a polymerization initiator, and purged using nitrogen gas for 1 hour. Polymerization was performed for about 24 hours at 70° C.

After the polymerization, the reaction product was precipitated in excess methanol (about 10 times methanol to one part reaction solution), and the precipitate was dried in a vacuum oven maintained at 50° C. for about 24 hours to separate the reaction product (yield 70%).

The obtained reaction product was a copolymer containing DBMST and AST monomers, having a weight average molecular weight of 11,157, and a polydispersity of 1.6. The result of FT-IR analysis of the copolymer is as follows.

FT-IR(KBr) (cm$^{-1}$): 2979 (C—H, t-butyl), 1767 (C=O, acetyl), 1727 (C=O, malonyl), 1369, 1216

EXAMPLE 3

Preparation of deacetylated copolymer (DBMST-hydroxystyrene (HST))

10 g of the copolymer obtained by Example 2 was refluxed in a mixed solution containing 10 ml of ammonium hydroxide (28%) and 50 ml of methanol for about 4 hours, to deacetylate the copolymer. The reaction product was slowly precipitated in excessive water.

After dissolving the precipitant in tetrahydrofuran THF, and then reprecipitating in excessive n-hexane, the precipitant was dried in a vacuum oven maintained at 50° C. to separate the reaction product (yield 90%).

The obtained reaction product was a copolymer containing DBMST and HST monomers at a mol ratio of about 25:75. The weight average molecular weight of the copolymer was 9,438, the polydispersity was 1.6, and transmittance against an ultraviolet ray was 74%/μm. The result of FT-IR analysis of the copolymer is as follows.

FT-IR(KBr)(cm$^{-1}$): 3440 (O—H), 2980 (C—H, t-butyl), 1728 (C=O), 1513, 1369, 1145

Copolymers having different polymerizing ratios of each monomer were obtained under the same conditions as the above. Then, the weight average molecular weight (Mw), polydispersity, and transmittance against ultraviolet rays (%/μm) of each copolymer were measured. To form a photoresist composition, triphenylsulfonium triflate (TPSOTf) of 3.0 weight percent based on the weight of the copolymer, was added to the copolymer as a photosensitive acid generator. The optimum exposure energy of the photoresist composition, required for forming a pattern with 0.30 μm line and space arrays, was then measured. The results are tabulated in Table 1.

TABLE 1

Optimum Exposure Energy of the Photoresist Compositions

| Copolymer | DBMST:HST | Weight Average Molecular Weight | Polydispersity | Transmittance (%/μm) | Optimum Exposure Energy (mJ/cm$^2$) |
|---|---|---|---|---|---|
| 1 | 35:65 | 10487 | 1.67 | 72 | 76 |
| 2 | 30:70 | 9954 | 1.75 | 73 | 55 |
| 3 | 28:72 | 8675 | 1.64 | 71 | 34 |
| 4 | 27:73 | 9627 | 1.61 | 73 | 35 |
| 5 | 26:74 | 10539 | 1.65 | 74 | 30 |
| 6 | 25:75 | 9438 | 1.60 | 74 | 30 |
| 7 | 20:80 | 9536 | 1.65 | 73 | 18 |

EXAMPLE 4

Preparation of copolymer (AST-t-butylacrylate (BA))

7.8 g (60 mmol) of BA (t-butylacrylate) and 20 g (120 mmol) of acetoxystyrene AST were dissolved in 140 ml of toluene. Then, the reaction product was separated through the same processes as in Example 2, except that 1.48 g of AIBN was added as a polymerization initiator.

The obtained reaction product was a copolymer containing BA and AST monomers, having a weight average molecular weight of 12,017, and polydispersity of 1.83. The result of FT-IR analysis of the copolymer is as follows.

FT-IR(KBr)(cm$^{-1}$): 2978 (C—H, t-butyl), 1767 (C=O, acetyl), 1727 (C=O), 1506, 1369 (C—H, t-butyl), 1217 (C—O)

EXAMPLE 5

Preparation of deacetylated copolymer (HST-BA)

10 g of the copolymer obtained by Example 4 was deacetylated by the same method as in Example 3. The obtained reaction product was a copolymer containing BA and hydroxystyrene HST monomer. The weight average molecular weight of the copolymer was 11,438, the polydispersity was 1.82, and transmittance against an ultraviolet rays was 74%/μm. The result of FT-IR analysis of the copolymer is as follows.

FT-IR(KBr)(cm$^{-1}$): 3397 (O—H), 2978 (C—H, t-butyl), 1699 (C=O), 1513, 1369 (C—H, t-butyl), 1231 (C—O)

EXAMPLE 6

Preparation of poly(ethoxy-1-ethyloxystyrene-HST)

After dissolving 12 g of poly-hydroxystyrene (poly(HST)) in 60 ml of THF, 3.6 g of ethylvinylether was added to the solution. The p-toluene sulfonic acid (p-TSA) was added to the mixture in sufficient quality to act as a catalyst, and reacted for 12 hours at room temperature. After 12 hours, the reaction product was slowly dropped into water in a ratio of 5 parts water to one part reaction product, and neutralized using potassium carbonate.

After dissolving the precipitant in THF, it was precipitated slowly in excess n-hexane. The precipitant was then dried in a vacuum oven maintained at 50° C. to separate the reaction product (yield 85%).

The obtained reaction product was a copolymer of poly(ethoxy-1-ethyloxystyrene-HST). The weight average molecular weight of the copolymer was 12,285, the polydispersity was 1.67, and transmittance against an ultraviolet ray was 73%/μm.

EXAMPLE 7

Preparation of a copolymer using poly(HST) and 3, 4-dihydro-2-pyran

A copolymer containing tetrahydropyranoxy styrene and hydroxystyrene monomer was prepared by the same method as in Example 6, except that 4.2 g of 3,4-dihydro-2-pyran was used instead of ethylvinylether (yield 80%).

The weight average molecular weight of the obtained copolymer was 13,587, the polydispersity was 1.74, and transmittance against an ultraviolet ray was 72%/μm.

EXAMPLE 8

Preparation of photoresist composition using a mixture of poly(DBMST-HST) and poly(HST-BA), and photolithographic performance using the same 0.3 g of poly(DMST-HST), prepared by Example 3, and 0.7 g of poly(HST-BA) prepared by Example, 5 were dissolved in 6 g of propylene glycol monomethyl ether acetate (PGMEA). Next, 0.03 g of TPSOTf was added as a photosensitive acid generator. The mixture was stirred and then filtered through a filter having pores of 0.2 μm, resulting in a photoresist composition.

The obtained photoresist composition was spin-coated to a thickness of approximately 0.5 μm onto a wafer having a material layer to be patterned, and the wafer was then soft-baked at approximately 140° C. for about 90 seconds. After soft-bake, the photoresist was exposed using a mask defining a patten with 0.30 μm line and space arrays and a stepper using a KrF eximer laser having a numerical aperture of 0.45. The wafer was then post-baked at approximately 140° C. for about 90 seconds. Finally, the photoresist was developed using 2.38 weight percent of tetramethylammonium hydroxide for 60 seconds to form a photoresist pattern. Then, the material layer underlying the patterned photoresist was etched using the resultant photoresist pattern.

A photoresist pattern having an excellent profile with 0.30 μm line and space arrays was formed using an exposure energy of 21 mJ/cm2, and a material layer pattern having an excellent profile was obtained using the photoresist pattern.

Several photoresist compositions were prepared by the same method as above, only varying the mixing ratio of the poly(DBMST-HST) and the poly(HST-BA). Then, photolithography was performed on those compositions to measure the optimum exposure energy needed to form a pattern having 0.30 μm line and space arrays. The results are shown in Table 2.

TABLE 2

Optimum Exposure Energy of the Photoresist Compositions

| Compositions | Poly(DBMST-HST):poly(HST-BA) | Optimum Exposure Energy(mJ/cm$^2$) |
|---|---|---|
| 1 | 50:50 | 58 |
| 2 | 40:60 | 45 |
| 3 | 35:65 | 36 |
| 4 | 30:70 | 31 |
| 5 | 25:75 | 26 |
| 6 | 20:80 | 22 |

EXAMPLE 9

Preparation of photoresist composition using a mixture of poly(DBMST-HST) and poly(HST-BA), and photolithographic performance using the same A photoresist composition was prepared and photolithography was performed thereon by the same method as in Example 8, except that 2 mg of diethanolamine was further added as an organic base, and soft-baking was performed at 130° C.

A photoresist pattern having an excellent profile, with 0.30 μm line and space arrays was formed using an exposure energy of 34 mJ/cm$^2$. A material layer pattern having an excellent profile was also obtained using the photoresist pattern.

EXAMPLE 10

Preparation of photoresist composition using a mixture of poly(DBMST-HST) and poly(ethoxy-1-ethyloxystyrene-co-hydroxystyrene)[poly(EEST-HST)], and photolithographic performance using the same A photoresist composition was prepared and photolithography was performed thereon by the same method as in Example 8, except that 0.7 g of poly(EEST-HST) was used instead of 0.7 g of poly(HST-BA), and soft-baking was performed at 130° C.

A photoresist pattern having an excellent profile, with 0.30 μm line and space arrays, was formed using an exposure energy of 30 mJ/cm$^2$.

Several photoresist compositions were prepared following the method described in Example 8, but changing the mixing ratio of the poly(DBMST-HST) and the poly(HST-EEST). Photolithography was then performed on these photoresist compositions that were obtained in order to measure the optimum exposure energy required to form a pattern with 0.30 μm line and space arrays. The results are shown in Table 3.

TABLE 3

Optimum Exposure Energy of the Photoresist Compositions

| Compositions | Poly(DBMST-HST):poly(HST-EEST) | Optimum Exposure Energy(mJ/cm$^2$) |
|---|---|---|
| 1 | 50:50 | 55 |
| 2 | 40:60 | 40 |

TABLE 3-continued

Optimum Exposure Energy of the Photoresist Compositions

| Compositions | Poly(DBMST-HST):poly(HST-EEST) | Optimum Exposure Energy(mJ/cm$^2$) |
|---|---|---|
| 3 | 35:65 | 34 |
| 4 | 30:70 | 30 |
| 5 | 25:75 | 26 |
| 6 | 20:80 | 22 |

EXAMPLE 11

Preparation of photoresist composition using a mixture of poly(DBMST-HST) and poly(EEST-HST), and photolithographic performance using the same A photoresist composition was prepared and photolithography was performed thereon by the same method as in Example 10, except that 2 mg of diethanolamine was further added as an organic base.

A photoresist pattern having an excellent profile, with 0.30 μm line and space arrays, was formed with exposure energy of 36 mJ/cm$^2$. A material layer pattern having an excellent profile was also obtained using the photoresist pattern.

EXAMPLE 12

Characteristics of the Photoresist Compositions (1) Thermal Stability

In order to measure the thermal stability of the photoresist composition according to the present invention, thermogravimetric analysis was performed on the copolymer formed by Example 3 which is poly(DBMST-HST). While heating at 10° C./min under a nitrogen atmosphere, the change in weight of the copolymer caused by the change of temperature was measured and calculated as a weight (%) with 100 weight (%) being the weight (%) at a temperature of 0° C. As can be seen from FIG. 1, the copolymer having the dialkylmalonate group as the major component of the photoresist composition according to the present invention, has a high thermal decomposition temperature (Td) of about 170° C.

(2) Contrast

In order to obtain a contrast curve for the photoresist composition according to the present invention, the thickness of a photoresist layer remaining after exposure was measured while varying the dose of the exposure energy. The photoresist composition was 1.0 g of poly(DBMST-HST) and 0.3 g of TPSOTf. The thickness of the initially coated photoresist layer was converted to 1 μm, to calculate the normalized thickness (μm) of the photoresist layer remaining in the exposed portion. The results are shown in FIG. 2.

Figure 2:
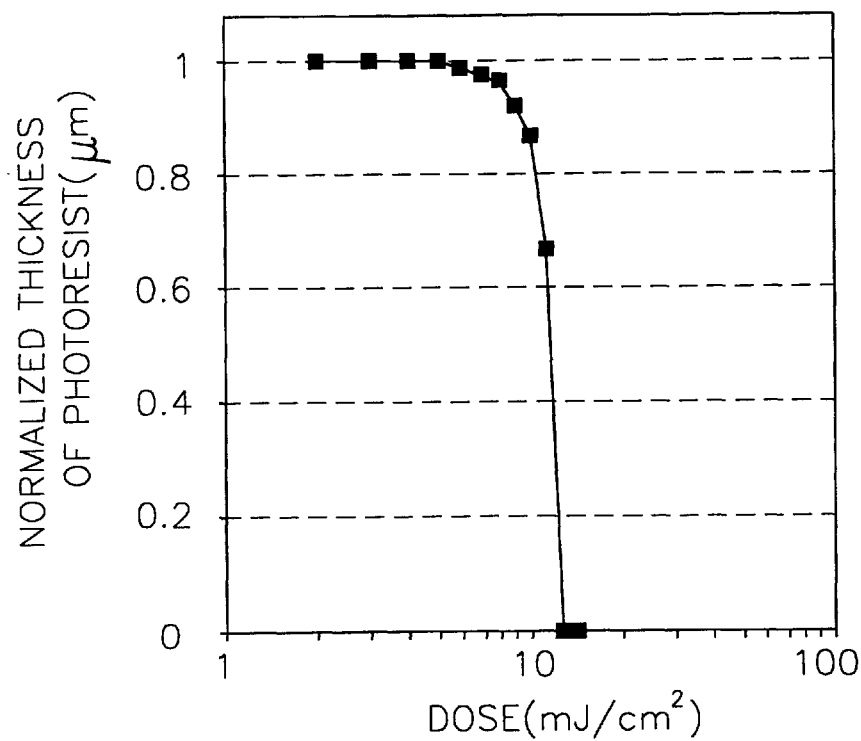
FIG. 2 is a graph showing a contrast curve of a photoresist film.

As shown in FIG. 2, the normalized thickness is maintained near 1 μm using an exposure energy of less than about 10 mJ/cm$^2$. However, when the exposure exceeds about 10 mJ/cm$^2$, the normalized thickness sharply decreases to zero over a very narrow range of exposure energy. That is, the contrast curve shows a steep slope at a specific dose of about 10 mJ/cm$^2$, which demonstrates that the contrast of the photoresist composition according to the present invention is very high.

The polymers and photoresist compositions of the present invention have several advantages over conventional polymers and photoresists. They permit pre- and post-exposure baking at temperatures that harden the photoresist without causing it to decompose, and there have increased solubility and contrast which permit sharper line and space arrays to be obtained than can be obtained using conventional photoresists.

The acid-liable di-alkylmalonate group bound to the backbone of the polymers of the present invention functions as an effective dissolution inhibitor in the photoresist compositions. Acid hydrolysis of the bulky di-alkylmalonate group into malonic acid during exposure to light considerably increases the solubility of the photoresist composition. The solubility difference before and after exposure, produces a contrast that is significantly higher than the contrast obtained using conventional photoresist compositions having a t-butoxycarbonyl (t-BOC) group as the acid-labile group.

Another advantage of the photoresist compositions of the present invention is that the photosensitive di-alkylmalonate-containing acid-labile dissolution inhibitor and the photosensitive acid generator are both thermally stable. The polymers therefore cause the photoresist compositions of the present invention to have a thermal decomposition temperature that is higher than the glass transition temperature of approximately 130° C. Thus the photoresists can be hardened by pre-baking without decomposing the photoresist. This hardening prevents contaminants from absorbing to the photoresist layer where they interfere with the photosensitive acid generator and cause defective patterns. The photoresist compositions of the present invention can be pre-baked at a high enough temperature to prevent adsorption of contaminants that result in defective patterns such as T-top profiles.

The present invention is not limited to the embodiments set forth above, and it is clearly understood that many variations may be made within the scope of the present invention by anyone of skill in the art.

What is claimed is:

1. A polymer mixture for use in a chemically amplified photoresist, comprising:

a polymer (A) polymerized with two or more different monomers, and having an acid-labile di-alkylmalonate group bound to the backbone of the polymer; and a polymer (B) polymerized with a monomer of (meth) acrylate derivative and one or more other monomers.

2. The polymer mixture of claim 1, wherein the di-alkylmalonate group is di-t-butylmalonate or di-tetrahydropyranylmalonate.

3. The polymer mixture of claim 1, wherein the polymers (A) and (B) are mixed at a weight ratio ranging of from about 0.1:0.9 to of 0.5:0.5.

4. The polymer mixture of claim 1, wherein:

the polymer (A) is of the chemical formula (CF1) and polymer (B) is of the chemical formula (CF2);

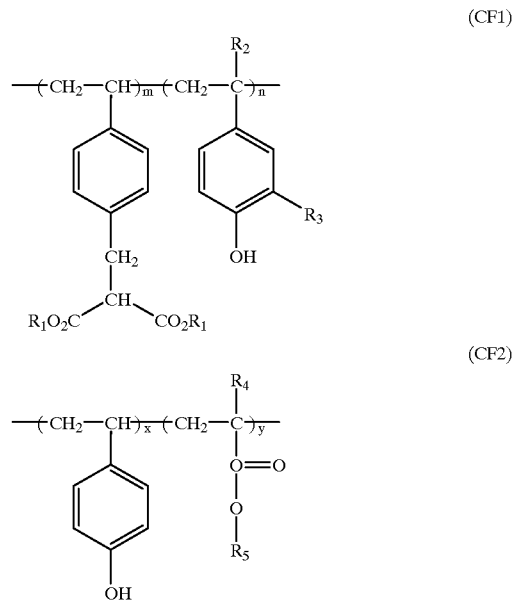

wherein:

R1 and R5 are each independently t-butyl or tetrahydropyranyl,

R2, R3 and R4 are each independently hydrogen or methyl, m, n, x and y are integers, the ratio of m/(m+n) is from about 0.01 to about 0.5, and the ratio of y/(x+y) is from about 0.01 to about 0.5;

the polymers (A) and (B) are mixed at a weight ratio ranging from about 0.1:0.9 to 0.5:0.5; and each of the polymers (A) and (B) has a weight average molecular weight ranging from 5,000 to 100,000.

5. A photoresist composition comprising:

a polymer mixture for a photoresist, comprising a polymer (A) polymerized with two or more different monomers and having an acid-labile di-alkylmalonate group bound to the backbone of the polymer, and a polymer (B) polymerized with a monomer of (meth)acrylate derivative and one or more other monomers, wherein the polymers (A) and (B) are mixed at a weight ratio ranging from 0.1:0.9 to 0.5:0.5; and a photosensitive acid generator.

6. The photoresist composition of claim 5, wherein the photoresist composition further comprises an organic base in an amount of from about 0.01 to about 2.0 weight percent based on the weight of the polymer mixture.

7. The photoresist composition of claim 6, wherein the organic base is triethylamine, triisobutylamine, diethanolamine or triethanolamine.

8. The photoresist composition of claim 5, wherein the photosensitive acid generator is triarylsulfonium salts, diaryliodonium salts or sulfonates.

9. The photoresist composition of claim 5, wherein:
the polymer (A) is of the chemical formula (CF1) and polymer (B) is of the chemical formula (CF2);

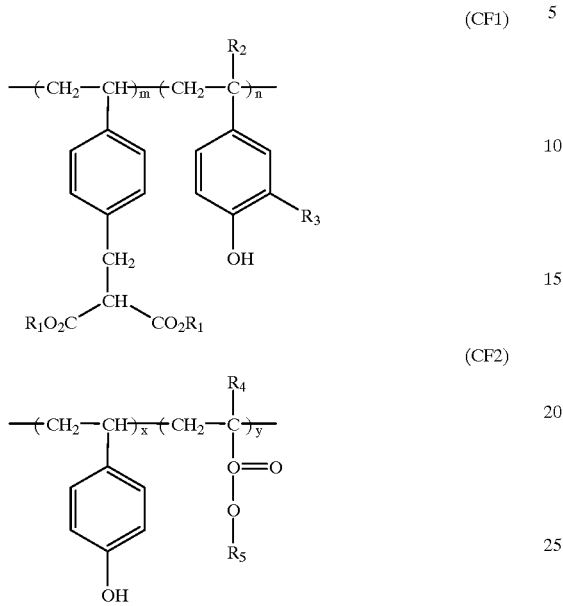

(CF1)

(CF2)

wherein:
R1 and R5 are each independently t-butyl or tetrahydropyranyl,
R2, R3 and R4 are each independently hydrogen or methyl,
m, n, x and y are integers,
the ratio of m/(m+n) is from about 0.01 to about 0.5, and
the ratio of y/(x+y) is from about 0.01 to about 0.5;
each of the polymers (A) and (B) has a weight average molecular weight ranging from 5,000 to 100,000; and
the photosensitive acid generator is in an amount of from about 1 to about 15 weight percent based on the weight of the polymer mixture.

10. The photoresist composition of claim 9, wherein R1 is t-butyl; R2, R3 and R4 are hydrogen; and R5 is t-butyl.

11. The photoresist composition of claim 9, wherein R1 is t-butyl; R2, R3 and R4 are hydrogen; and R5 is tetrahydropyranyl.

12. The photoresist composition of claim 9, wherein R1 is t-butyl; R2 and R3 are hydrogen; R4 is methyl and R5 is t-butyl.

13. The photoresist composition of claim 9, wherein R1 is t-butyl; R2 and R3 are hydrogen; R4 is methyl; and R5 is tetrahydropyranyl.

14. A polymer mixture for use in a chemically amplified photoresist, comprising:
a polymer (A) polymerized with two or more different monomers, and having an acid-labile di-alkylmalonate bound to the backbone of the polymer; and
a polymer (B) polymerized with a monomer of alkoxystyrene and one or more other monomers.

15. The polymer mixture of claim 14, wherein the di-alkylmalonate is di-t-butylmalonate or di-tetrahydropyranylmalonate.

16. The polymer mixture of claim 14, wherein the polymers (A) and (B) are mixed at a weight ratio ranging from about 0.1:0.9 to about 0.5:0.5.

17. The polymer mixture of claim 14, wherein:
the polymer (A) is of the chemical formula (CF1) and polymer (B) is of the chemical formula (CF3);

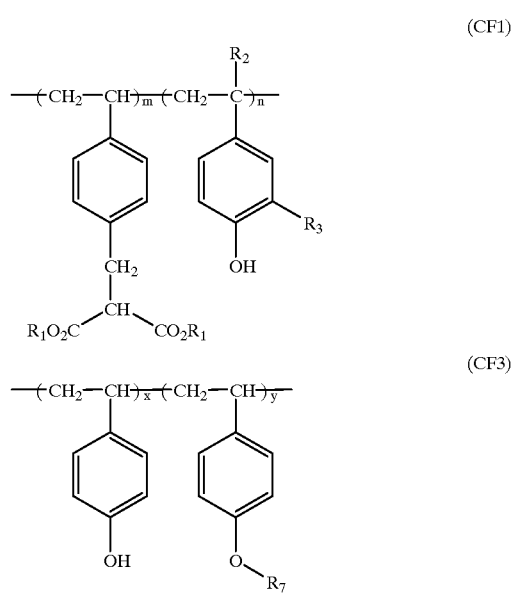

(CF1)

(CF3)

wherein:
R1 is t-butyl or tetrahydropyranyl;
R2 and R3 are each independently hydrogen or methyl;
R7 is alkoxy-1-ethyl, tetrahydropyranyl, t-butyl or t-butoxycarbonyl;
m, n, x and y are integers,
the ratio of m/(m+n) is from about 0.01 to about 0.5, and
the ratio of y/(x+y) is from about 0.01 to about 0.5;
the polymers (A) and (B) are mixed at a weight ratio ranging from about 0.1:0.9 to 0.5:0.5; and
each of the polymers (A) and (B) has a weight average molecular weight ranging from 5,000 to 100,000.

18. A photoresist composition comprising:
a polymer mixture for a photoresist, including a polymer (A) polymerized with two or more different monomers and having an acid-labile di-alkylmalonate group bound to the backbone of the polymer, and a polymer (B) polymerized with a monomer of alkoxystyrene and one or more other monomers, wherein the polymers (A) and (B) are mixed at a weight ratio ranging from 0.1:0.9 to 0.5:0.5; and
a photosensitive acid generator.

19. The photoresist composition of claim 18, wherein the photoresist composition further comprises an organic base in an amount of from about 0.01 to about 2.0 weight percent based on the weight of the polymer mixture.

20. The photoresist composition of claim 19, wherein the organic base is triethylamine, triisobutylamine, diethanolamine or triethanolamine.

21. The photoresist composition of claim 18, wherein the photosensitive acid generator is a member selected from the group comprising triarylsulfonium salts, diaryliodonium salts and sulfonates.

22. The photoresist composition of claim 18, wherein:
the polymer (A) is of the chemical formula (CF1) and polymer (B) is of the chemical formula (CF3);

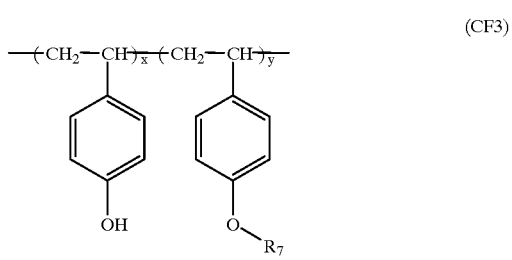

(CF3)

wherein:
R1 is t-butyl or tetrahydropyranyl;
R2 and R3 are each independently hydrogen or methyl;
R7 is alkoxy-1-ethyl, tetrahydropyranyl, t-butyl or t-butoxycarbonyl; m, n, x and y are integers, the ratio of m/(m+n) is from about 0.01 to about 0.5, and the ratio of y/(x+y) is from about 0.01 to about 0.5;

each of the polymers (A) and (B) has a weight average molecular weight ranging from 5,000 to 100,000; and the photosensitive acid generator is in an amount of from about 1 to about 15 weight percent based on the weight of the polymer mixture.

23. The photoresist composition of claim 22, wherein R1 is t-butyl, R2 and R3 are hydrogen, and R7 is ethoxy-1-ethyl.

24. The photoresist composition of claim 22, wherein R1 is t-butyl, R2 and R3 are hydrogen, and R7 is tetrahydropyranyl.

25. The photoresist composition of claim 22, wherein R1 is t-butyl, R2 and R3 are hydrogen, and R7 is t-butyl.

26. The photoresist composition of claim 22, wherein R1 is t-butyl, R2 and R3 are hydrogen, and R7 is t-butoxycarbonyl.

* * * * *